US008373086B2

(12) United States Patent  
Kim et al.

(10) Patent No.: US 8,373,086 B2  
(45) Date of Patent: Feb. 12, 2013

(54) PLASMA PROCESSING APPARATUS AND METHOD FOR PLASMA PROCESSING

(75) Inventors: Hyoung Won Kim, Suwon-Si (KR); Young Soo Seo, Hwaseong-Si (KR); Chi Kug Yoon, Anseong-Si (KR); Jun Hyeok Lee, Osan-Si (KR); Young Ki Han, Seoul (KR); Jae Chul Choi, Osan-Si (KR)

(73) Assignee: Charm Engineering Co., Ltd. (KR)

( * ) Notice: Subject to any disclaimer, the term of this patent is extended or adjusted under 35 U.S.C. 154(b) by 149 days.

(21) Appl. No.: 12/936,671

(22) PCT Filed: Apr. 6, 2009

(86) PCT No.: PCT/KR2009/001749  
§ 371 (c)(1),  
(2), (4) Date: Oct. 6, 2010

(87) PCT Pub. No.: WO2009/125951  
PCT Pub. Date: Oct. 15, 2009

(65) Prior Publication Data  
US 2011/0024399 A1 Feb. 3, 2011

(30) Foreign Application Priority Data

Apr. 7, 2008 (KR) .................. 10-2008-0032040  
Apr. 7, 2008 (KR) .................. 10-2008-0032041  
Apr. 7, 2008 (KR) .................. 10-2008-0032042

(51) Int. Cl.  
*B23K 10/00* (2006.01)

(52) U.S. Cl. ......... 219/121.41; 219/121.44; 219/121.43; 219/121.58; 118/729; 156/345.54; 156/345.47; 216/67

(58) Field of Classification Search ............... 219/121.4, 219/121.41, 121.43, 121.44; 216/67, 71; 156/345.33, 345.47, 345.54; 118/729  
See application file for complete search history.

(56) References Cited

U.S. PATENT DOCUMENTS

| 5,958,140 | A | * | 9/1999 | Arami et al. ................ 118/725 |
| 6,013,136 | A | | 1/2000 | Mathuni |
| 7,601,223 | B2 | * | 10/2009 | Lindfors et al. ............. 118/715 |
| 7,789,961 | B2 | * | 9/2010 | Nelson et al. ............... 118/715 |
| 7,967,996 | B2 | * | 6/2011 | Collins et al. ................ 216/67 |
| 7,993,465 | B2 | * | 8/2011 | Jennings et al. ............. 134/1.1 |
| 8,088,225 | B2 | * | 1/2012 | Goodman et al. ........... 118/730 |

FOREIGN PATENT DOCUMENTS

| KR | 1020050049903 A | 5/2005 |
| KR | 100777467 B1 | 11/2007 |

OTHER PUBLICATIONS

PCT International Searching Authority, "Written Opinion," (Nov. 11, 2009).

* cited by examiner

*Primary Examiner* — Mark Paschall

(57) ABSTRACT

Provided are a plasma processing apparatus and method. The plasma processing apparatus includes a chamber, an upper electrode, a lower electrode, a substrate support, and a movement member. The upper electrode is disposed at an inner upper portion of the chamber. The lower electrode faces the upper electrode at an inner lower portion of the chamber to support a substrate such that a bevel of the substrate is exposed in a substrate level etching process. The substrate support is disposed between the upper electrode and the lower electrode to support the substrate such that a central region of a bottom surface of the substrate is exposed in a substrate backside etching process. The movement member is configured to move the substrate support to separate the substrate from the substrate support in the substrate backside etching process.

20 Claims, 7 Drawing Sheets

300 : 310, 320, 330
500 : 500A, 500B
600 : 600A, 600B

500 : 500A, 500B
600 : 600A, 600B

300 : 310, 320, 330
500 : 500A, 500B
600 : 600A, 600B

300 : 310, 320, 330
500 : 500A, 500B
600 : 600A, 600B

300 : 310, 320, 330

PLASMA PROCESSING APPARATUS AND METHOD FOR PLASMA PROCESSING

TECHNICAL FIELD

The present disclosure relates to a plasma processing apparatus and a method for plasma processing, and more particularly, to a plasma processing apparatus and a method for plasma processing in which substrate backside etching and substrate bevel etching processes can be sequentially performed in a single apparatus.

BACKGROUND ART

In general, a semiconductor device and a flat display device are manufactured by depositing a plurality of thin films on an entire surface of a substrate and etching the deposited thin films to form devices having predetermined patterns on the substrate. That is, a thin film is deposited on the entire surface of the substrate using a predetermined deposition apparatus, and then a portion of the thin film is etched using an etching apparatus to form a thin film having predetermined patterns.

However, the thin film is deposited also on a bottom surface of the substrate in the thin film deposition process, or a foreign substance such as particles remains on the bottom surface of the substrate after the etch process is performed. Also, the thin film or the foreign substance such as the particles remains on a separate device configured to transfer the substrate or in an edge region of the substrate in which circuit patterns are not formed, i.e., a bevel region. Thus, the substrate may be curved, or it may be difficult to align the substrate in subsequent processes due to the foreign substance deposited on the bottom surface and in the bevel region of the substrate. In addition, the thin film or the particles remaining on the bottom surface and in the bevel region of the substrate acts as process defects in the subsequent processes to reduce the production yield. Thus, for removing the thin film and the particles remaining on the bottom surface and in the bevel region of the substrate, a dry etching process is mainly performed to repeatedly remove the thin film and the foreign substance such as the particles deposited on the bottom surface and a bevel of the substrate, and then, the subsequent processes are performed.

However, in the related art technique, substrate backside etching and substrate bevel etching processes were performed using separate substrate backside etching and substrate bevel etching apparatuses, respectively. For example, the substrate backside etching and substrate bevel etching apparatuses are formed in one cluster together with a deposition apparatus or an etching apparatus, and then, substrate backside etching and substrate bevel etching processes are separately performed on a substrate in which a deposition process or an etching process is completed. Thus, in order to perform the substrate backside etching process and substrate bevel etching processes, at least two apparatuses are required. In addition, the number of production facilities increases and production costs increases because the number of etching apparatuses increases. Also, since the bottom surface and bevel of the substrate are etched using the two etching apparatuses, the total processing time increases.

DISCLOSURE OF INVENTION

Technical Problem

The present disclosure provides a plasma processing apparatus and method in which substrate backside etching and substrate bevel etching processes can be sequentially performed in a single apparatus to reduce production costs and production time.

The present disclosure also provides a plasma processing apparatus and method in which a substrate holder configured to support an edge portion of a bottom surface of a substrate and a movement member configured to move the substrate holder can be provided to sequentially perform substrate backside etching and substrate bevel etching processes.

Technical Solution

In accordance with an exemplary embodiment, a plasma processing apparatus includes: a chamber; an upper electrode disposed at an inner upper portion of the chamber; a lower electrode facing the upper electrode at an inner lower portion of the chamber to support a substrate such that a bevel of the substrate is exposed in a substrate bevel etching process; a substrate support disposed between the upper electrode and the lower electrode to support the substrate such that a central region of a bottom surface of the substrate is exposed in a substrate backside etching process; and a movement member configured to move the substrate support to separate the substrate from the substrate support in the substrate backside etching process.

The plasma processing apparatus may further include: a non-reaction gas injection hole formed in a bottom surface of the upper electrode to inject a non-reaction gas; a first reaction gas injection hole separated from the non-reaction gas injection hole to inject a reaction gas; and a second reaction gas injection hole formed in a top surface of the lower electrode to inject the reaction gas. The first reaction gas injection hole may be separated from the non-reaction gas injection hole and formed in an edge portion of the bottom surface of the upper electrode or a lateral surface of the upper electrode. The first reaction gas injection hole may be spaced from the upper electrode and formed in an upper portion of the chamber.

The plasma processing apparatus may further include first and second reaction gas injection holes formed in a top surface and a lateral surface of the lower electrode, respectively.

The lower electrode may be separable into pieces. The lower electrode may include: a first lower electrode disposed at a central portion in a plate shape; and a second lower electrode separated from the first lower electrode, the second lower electrode being disposed outside the first lower electrode.

The plasma processing apparatus may further include: a first elevating member connected to a lower portion of the first lower electrode to move the first lower electrode upward and downward and a second elevating member connected to a lower portion of the second lower electrode to move the second lower electrode upward and downward. The first elevating member may be inserted into the second elevating member.

The plasma processing apparatus may further include: a non-reaction gas injection hole formed in a bottom surface of the upper electrode; a first reaction gas injection hole formed in a top surface of the first lower electrode; and a second reaction gas injection hole formed in a top surface or a lateral surface of the second lower electrode other than a recess of the second lower electrode.

The plasma processing apparatus may further include a third reaction gas injection hole formed in the bottom surface of the upper electrode, the third reaction gas injection hole being separated from the non-reaction gas injection hole. The plasma processing apparatus may further include a third reaction gas injection hole formed in the upper portion of the chamber, the third reaction gas injection hole being spaced from the upper electrode.

The substrate support may include: a substrate holder configured to support the substrate; and a buffer member connecting the substrate holder to a lower lateral surface of the lower electrode.

The substrate holder may be disposed at a position higher than that of a top surface of the lower electrode.

The buffer member may include: a body in which an inner space having an opened upper side is provided; an elastic member disposed in the inner space of the body; and a holder support disposed on an upper portion of the elastic member and extended to protrude toward an upper portion of the body.

The plasma processing apparatus may further include a hard stopper disposed in an upper portion of the chamber, the hard stopper being spaced from the upper electrode.

A portion of the movement member may be positioned inside the chamber perforating an upper side of the chamber. The movement member may be movable upward and downward and, as it moves downward, pushes the substrate holder downward. A portion of the movement member is positioned inside the chamber perforating a lower side of the chamber, and connected to the substrate holder. The movement member may downwardly pull and move the substrate holder.

In accordance with another exemplary embodiment, a plasma processing method includes etching a bottom surface and a bevel of the substrate within the chamber after loading a substrate into a chamber.

After loading the substrate into the chamber, the plasma processing method may further include: injecting a non-reaction gas through a bottom surface of an upper electrode disposed at an upper portion of the chamber; and injecting a reaction gas through a top surface and a lateral surface of a lower electrode disposed at a lower portion of the chamber to etch the bottom surface and the bevel of the substrate within the chamber.

After loading the substrate into the chamber, the plasma processing method may further include: injecting a non-reaction gas through a bottom surface of an upper electrode disposed at an upper portion of the chamber; and injecting a reaction gas through top surfaces of first and second lower electrodes disposed at a lower portion of the chamber to etch the bottom surface and the bevel of the substrate within the chamber.

Advantageous Effects

A substrate holder configured to support an edge portion of a substrate and a movement member configured to move the substrate holder are provided, and a lower electrode of a lower chamber supports a bottom surface of the substrate. Thus, the substrate holder supports the edge portion of the bottom surface of the substrate to perform a substrate backside etching process, and the substrate holder is moved downwardly using the movement member and the lower electrode supports the bottom surface of the substrate to perform a substrate bevel etching process.

In accordance with the present disclosure, the substrate backside etching and substrate bevel etching processes can be sequentially performed using the same plasma processing apparatus. Thus, the number of plasma processing apparatuses can be reduced when compared to a related art plasma processing apparatus, and thus, production time and production costs can be reduced.

BRIEF DESCRIPTION OF DRAWINGS

Exemplary embodiments can be understood in more detail from the following description taken in conjunction with the accompanying drawings, in which.

MODE FOR THE INVENTION

Figure 1:
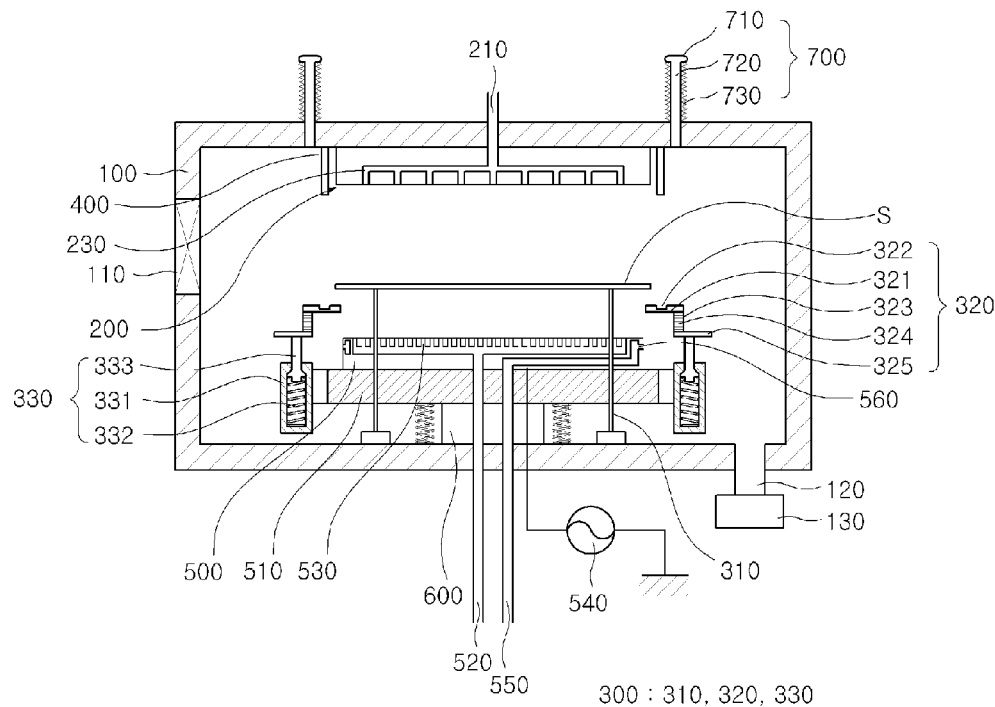
FIG. 1 is a cross-sectional view of a plasma processing apparatus in accordance with an exemplary embodiment

Hereinafter, specific embodiments will be described in detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. In the figures, like reference numerals refer to like elements throughout.

FIG. 1 is a cross-sectional view of a plasma processing apparatus in accordance with an exemplary embodiment. FIG. 1 illustrates a cross-sectional view of a plasma processing apparatus that can sequentially perform substrate backside etching and substrate bevel etching processes.

Referring to FIG. 1, a plasma processing apparatus in accordance with an exemplary embodiment includes a chamber 100, an upper electrode 200, a substrate support 300, a hard stopper 400, a lower electrode 500, and an elevating member 600. The upper electrode 200 is provided at an inner upper portion of the chamber 100 and connected to a ground terminal. The substrate support 300 is provided at an inner lower portion of the chamber 100 to support a substrate S. The hard stopper 400 is provided at the inner upper portion of the chamber 100 and in contact with the substrate support 300 to maintain a distance between the upper electrode 200 and the substrate S. A portion of the substrate support 300 is fixed to a side of the lower electrode 500, and a power is applied to the lower electrode 500. The elevating member 600 raises and lowers the substrate support 300 and the lower electrode 500. The plasma processing apparatus further includes a movement member 700 configured to move the substrate support 300. A non-reaction gas injection hole 230 for supplying a non-reaction gas onto a top surface of the substrate S is formed in a bottom surface of the upper electrode 200. A first reaction gas injection hole 530 configured to supply a reaction gas for etching a bottom surface of the substrate S is formed in a top surface of the lower electrode 500. A second gas injection hole 560 configured to supply a reaction gas for etching a bevel of the substrate S is formed in a lateral surface of the lower electrode 500.

In general, the chamber 100 has a cylindrical shape or a rectangular box shape. The chamber 100 provides a predetermined space for performing a substrate treatment process therein. Although the chamber 100 has the cylindrical shape or the rectangular box shape in this embodiment, the present invention is not limited thereto. For example, the chamber 100 may have a shape corresponding to that of the substrate S. A substrate gate 110 for carrying the substrate S into and out of the chamber 100 is formed in one sidewall of the chamber 100. An exhaust part 120 for exhausting reaction by-products such as particles generated during an etching process into the outside is provided in a bottom surface of the chamber 100. An exhaust unit 130 for exhausting contaminants within the chamber 100 into the outside, e.g., a vacuum pump is connected to the exhaust part 120. Although the integral chamber 100 is provided in this embodiment, the present invention is not limited thereto. For example, the chamber 100 may include a lower chamber having an opened upper side and a chamber lid configured to cover the opened upper side of the lower chamber.

The upper electrode 200 protrudes from an inner surface of an upper portion of the chamber 200 and may have a circular plate shape. The upper electrode 200 is connected to the ground terminal to generate plasma using an electric potential difference between the upper electrode 200 and the lower electrode 500 in which a high frequency power is applied. The upper electrode 200 may have a diameter greater than that of the substrate S. Also, the upper electrode 200 may have the same diameter as that of a region except a bevel region, i.e., a central region of the substrate S. A plurality of non-reaction gas injection holes 230 may be formed in the upper electrode 200. The non-reaction gas injection holes 230 inject a non-reaction gas into the substrate S such that a top surface of the substrate S is not damaged by the plasma during substrate backside etching and substrate bevel etching processes. For this, the non-reaction gas injection holes 230 may be formed in an entire surface of a bottom surface of the upper electrode 200. The non-reaction gas injection holes 230 may be formed in the bottom surface of the upper electrode 200 in a region corresponding to the top surface of the substrate S. The non-reaction gas injection holes 230 may have various shapes such as a circular shape and an oval shape. The non-reaction gas injection holes 230 communicate with a non-reaction gas supply part 210. The non-reaction gas supplied through the non-reaction gas supply part 210 may include a hydrogen gas, a nitrogen gas, or an inert gas. In addition, the non-reaction gas may include a non-reactive gas, i.e., a gas that does not react with the top surface of the substrate S. The substrate S may include a wafer for manufacturing a semiconductor device or a glass substrate for manufacturing a display device. The top surface of the substrate S may be a surface on which a device having predetermined thin film patterns is formed or a surface on which an etching of the substrate S is not required. A cooling passage (not shown) connected to a cooling water circulation unit (not shown) disposed outside the chamber 100 may be provided inside the upper electrode 200.

The substrate support 300 includes a lift pin on which the substrate carried from the outside is seated, a substrate holder 320 for supporting an edge portion of the bottom surface of the substrate S, and a buffer member 330 connected between the substrate holder 320 and the lower electrode 550.

The lift pin 310 passes through the lower electrode 500 to protrude upwardly and downwardly from the lower electrode 500. The lift pin 310 may moved upwardly and downwardly together with the lower electrode 500. The substrate S introduced into the chamber 100 from the outside through the substrate gate 110 is seated on the lift pin 310. The lift pin may be provided in plurality, and preferably, at least three lift pins may be provided to stably support the bottom surface of the substrate S.

The substrate holder 320 supports the edge portion of the bottom surface of the substrate S seated on an upper portion of the lift pin 310 and is vertically moved together with the lower electrode 500 to position the substrate S at a process position. The substrate holder 320 includes a seat 321 on which the substrate S is seated and a sidewall 323 configured to support a lower portion of the seat 321. The seat 321 may have a circular ring shape having a predetermined width. In this case, almost the entire edge portion of the bottom surface of the substrate S may be seated on a top surface of the seat 321. Also, a plurality of grooves 322 recessed inwardly may be formed in the top surface of the seat 321. The grooves 322 may be in contact with the hard stopper 400 provided at the inner upper portion of the chamber 100 when the substrate holder 320 is lifted in order to position the substrate S at the process position. Thus, since the grooves 322 of the substrate holder 320 is in contact with the hard stopper 400, the lower electrode 100 is spaced a predetermined distance, e.g., a distance of approximately 0.5 mm or less, from the substrate S. The plurality of grooves 322 formed in the top surface of the seat 321 may not be provided as necessary. Although the seat 321 has the circular ring shape in this embodiment, the present invention is not limited thereto. For example, the seat may have any other shape in accordance with a shape of the substrate S. The sidewall 323 has a cylindrical shape with a vertical penetration opening at its center portion, and a top surface of the sidewall 323 is coupled to a bottom surface of the seat 321. The sidewall may be coupled to the seat 321 using a separate coupling member or adhere to the seat 321 using an adhesive member. A plurality of exhaust holes 324 is formed in the sidewall 323 to horizontally pass through the sidewall 323. The reaction gas injected from the upper electrode 200 is exhausted through the exhaust holes 324. The exhaust holes 324 may have a circular or polygonal shape, or some of the exhaust holes 324 may have a circular shape and the other may have a polygonal shape. A support 325 may be further provided to protrude outwardly from a bottom surface of the sidewall 323. The support 325 is connected to an upper portion of the buffer member 330 connected between the substrate holder 320 and the lower electrode 500.

The buffer member 330 is disposed between the lower electrode 500 and the substrate holder 320 to connect the substrate holder 320 to the lower electrode 500. The buffer member 330 shrinks or expands to receive a portion of the substrate holder 320 moved downwardly by the movement member 700 or restore the substrate holder 320. The buffer member 330 includes a body 331, an elastic member 332 provided inside the body 331, and a holder support 333 disposed on an upper portion of the elastic member 332. The body has a cylindrical or polyhedral shape, and a predetermined space having an opened upper side is provided inside the body 331. The elastic member 332 is provided in the predetermined space of the body 331 and is fixed to an inner bottom surface of the body 331 to shrink and expand. A spring may be used as the elastic member 332. The holder support 333 is disposed on the upper portion of the elastic member 333, and holder support 333 is partially inserted into the body 331 in which the predetermined space is provided to protrude upwardly from the body 331. An outer surface of the body 331 of the buffer member 330 is coupled to an outer surface of an insulating plate 510 such that the buffer member 330 is fixed to an outer surface of the lower electrode 500. An upper portion of the holder support 333 is coupled to a lower portion of the substrate holder 320. The buffer member 330 may be provided in plurality and spaced from the outer surface of the lower electrode 500. In this case, the buffer members may be coupled to the insulating plate 510 along a circumference of the insulating plate 510.

The hard stopper 400 is spaced from the lower electrode 200 in a horizontal direction and disposed at the inner surface of the upper portion of the chamber 100. The hard stopper 400 protrudes toward the substrate holder 320. The hard stopper 400 maintains a distance between the upper electrode 200 and the substrate S by a predetermined distance, e.g., by approximately 0.5 mm or less during substrate backside cleaning and substrate bevel cleaning processes. That is, the hard stopper 400 is in contact with the upper portion, particularly the grooves 322, of the lifting substrate holder 320, and thus, the substrate S supported by the substrate holder 320 is precisely spaced from the bottom surface of the upper electrode 300 by a previously set distance. At this time, the hard stopper 400 may have a circular ring shape to form a closed curve at the bottom surface of the upper electrode 200, or the hard stopper 400 may have a divided ring shape. Also, a protrusion length of the hard stopper 400 may be decided in accordance with a width of the upper electrode 200, a thickness of the substrate S, a depth of each of the grooves, and the distance between the upper electrode 200 and the substrate S.

The lower electrode 500 may have a circular plate shape, and also, the lower electrode 500 may have a shape corresponding to that of the substrate S. That is, the lower electrode 500 has a circular shape when the substrate S has a circular shape equal to that of the wafer, and the lower electrode 500 has a rectangular shape when the substrate S has a rectangular shape equal to that of the glass substrate. The first reaction gas injection hole 530 configured to supply the reaction gas for etching the bottom surface of the substrate S is formed in the top surface of the lower electrode 500. The second gas injection hole 560 configured to supply the reaction gas for etching the bevel of the substrate S is formed in the lateral surface of the lower electrode 500. The first reaction gas injection hole 530 communicates with a first reaction gas supply part 520, and the second reaction gas injection hole 560 communicates with a second reaction gas supply part 550. The first reaction gas injection hole 530 is separated from the second reaction gas injection hole 560, and the first reaction gas supply part 520 is separated also from the second reaction gas supply part 550. The first reaction gas injection hole 530 and the second reaction gas injection hole 560 may have various shapes such as a circular shape and an oval shape, respectively. A high frequency power supply 540 for applying a high frequency signal to the lower electrode 500 is disposed under the lower electrode 500. The high frequency signal applied from the high frequency power supply 540 activates the reaction gas injected through the first and second reaction gas injection holes 530 and 560 to generate the plasma in a space formed under the substrate S. The reaction gas supplied through the first and second reaction gas supply parts 520 and 550 may include at least one of fluorine-based gases such as $CF_4$, $CHF_4$, $SF_6$, $NF_3$, $C_2F_6$, $C_4F_8$, $F_2$, and $F_2N_2$ and chlorine-based gases such as $BCl_3$ and $Cl_2$. The insulating plate 510 may be disposed on the lower portion of the lower electrode 500. The insulating plate 510 supports the lower electrode 500.

The elevating member 600 is connected to a bottom side of the lower electrode 500 to lift both the lower electrode 500 and the substrate holder 320 connected to the lower electrode 500. The elevating member 600 is connected to the bottom side of the lower electrode 500, particularly, a bottom surface of the insulating plate 510. A driving part (not shown) such as a motor may be further connected to the elevating member 600 such that a driving force is provided to the elevating member 600 to raise and lower the elevating member 600.

The movement member 700 is disposed on an outer upper portion of the chamber 100, and a portion of the movement member 700 passes through an upper wall of the chamber 100. The movement member 700 has elasticity. The movement member 700 is moved downwardly toward the lower portion of the chamber 100 and in contact with the substrate holder 320 to move the substrate holder 320 in a downward direction. That is, when the movement member 700 is moved downwardly to push the substrate holder 320 in the downward direction, the holder support 333 of the buffer member 330 connected to the substrate holder 320 is moved downwardly due to the shrinking of the elastic member 332. Thus, the seat 321 of the substrate holder 320 is moved to a position lower than their initial position. The movement member 700 includes a horizontal part 710, a vertical part 710 vertically extending downward from the horizontal part 710, and an elastic member 730 surrounding a portion of the vertical part 710. The horizontal part 710 is parallel to the upper wall of the chamber 100. For example, the vertical part 720 extends downwardly from a central portion of a bottom surface of the horizontal part 710 to pass through the upper wall of the chamber 100, protrude downwardly form the upper wall of the chamber 100, and contact with the substrate holder 320. The elastic member 730 surrounds the vertical part 720 from the bottom surface of the horizontal part 710 to an upper outer wall of the chamber 100 and shields the chamber 100 from external air. A bellows may be used as the elastic member 730, and the movement member 700 has elasticity due to the elastic member 730. The movement member 700 may have a circular ring shape, and in this case, the substrate holder 320 may also have a circular ring shape. The movement member 700 may be separated into a plurality of members. In this case, the movement member 700 may be separated into three or more members symmetrically separated from each other. Also, a driving part (not shown) such as a motor or an air cylinder may be further connected to the movement member 700 to provide a driving force to the movement member 700 and vertically move the movement member 700.

The movement member 700 may have various shapes and be disposed at various positions. For example, the movement member 700 may be disposed in a lower portion of the chamber 100. In this case, the movement member 700 is connected to the substrate holder 320, and the elastic member 332 within the body 331 of the buffer member 330 may not be provided. That is, the movement member 700 is connected to the holder support 333 within the body 331 of the buffer member 330. Also, when the lower electrode 500 is lifted, the substrate holder 320 is lifted together with the movement member 700, and thus, the substrate holder 320 supports the substrate S to perform the substrate backside etching process. In case where the lower electrode 500 is further lifted to support the bottom surface of the substrate S, the movement member 700 downwardly pulls the substrate holder 320, and thus, the substrate holder 320 is moved in a downward direction to perform the substrate bevel etching process.

In the plasma processing apparatus in accordance with an exemplary embodiment, the substrate holder 320 configured to support the substrate S is lifted and coupled to the hard stopper 400 to space the substrate S from the upper electrode 200 by a predetermined distance. And then, the substrate backside etching process is performed. The lower electrode 500 is lifted to support the substrate S on the top surface of the lower electrode 500, and the substrate holder 320 is downwardly moved by the movement member 700 to perform the substrate bevel etching process. A plasma processing method in accordance with an exemplary embodiment will be described with reference to FIGS. 2 through 4.

Figure 2:
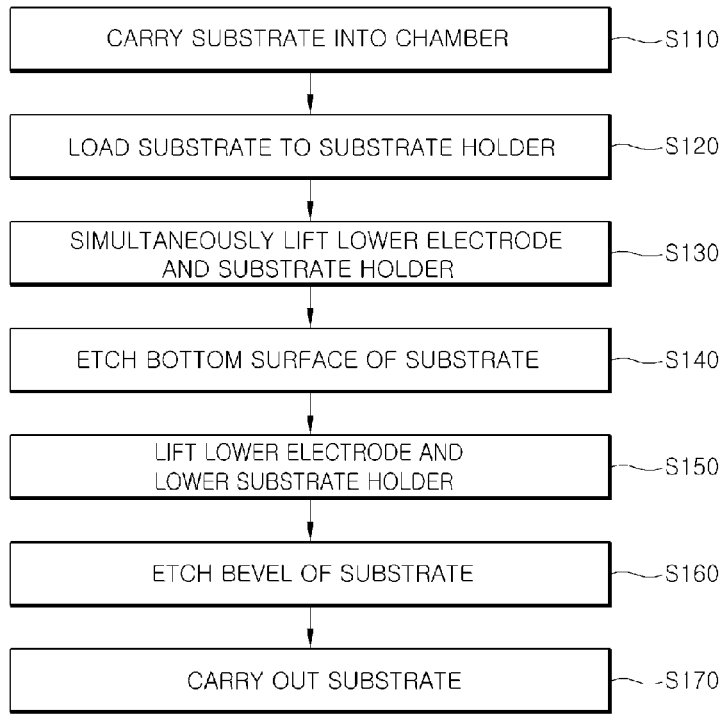
FIG. 2 is a flowchart of a plasma processing method in accordance with an exemplary embodiment
Figure 3:
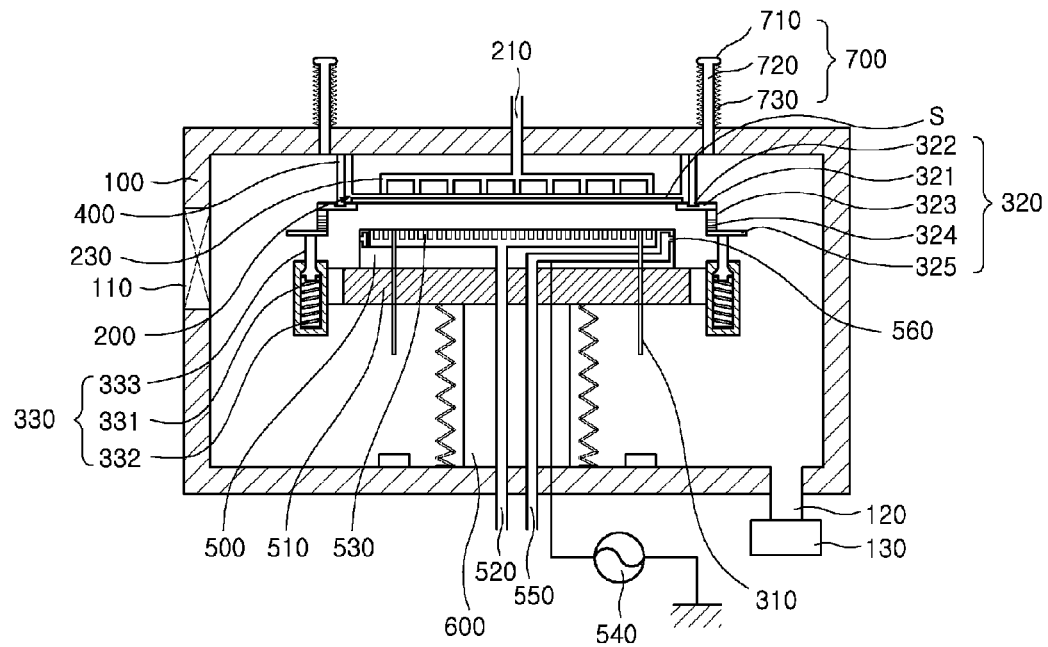
FIGS. 3 and 4 are cross-sectional views of a plasma processing apparatus in each of processes constituting a plasma processing method in accordance with an exemplary embodiment
Figure 4:
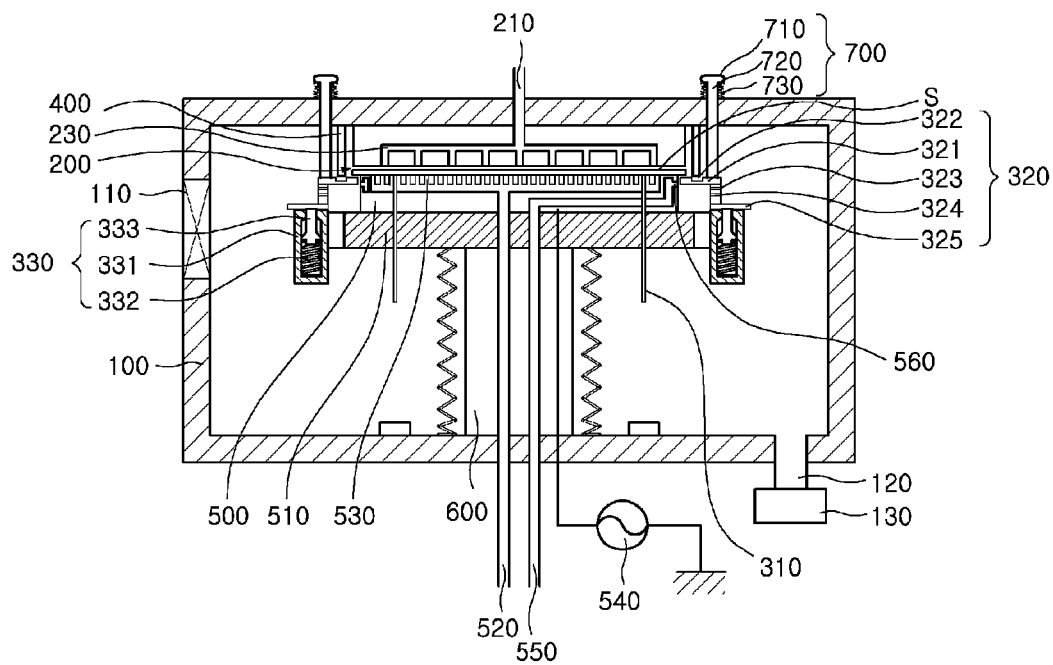

FIG. 2 is a flowchart of a plasma processing method in accordance with an exemplary embodiment, and FIGS. 3 and 4 are cross-sectional views of a plasma processing apparatus in each of processes constituting a plasma processing method in accordance with an exemplary embodiment.

Referring to FIG. 2, the plasma processing method in accordance with an exemplary embodiment includes carrying the substrate S into the chamber 100 (operation S110), loading the substrate S on the substrate holder 320 (operation S120), simultaneously lifting the substrate holder 320 and the lower electrode 500 (operation S130), etching the bottom surface of the substrate S (operation S140), downwardly moving the substrate holder 320 to support the substrate S on the top surface of the lower electrode 500 (operation S150), etching the bevel of the substrate S (operation S160), and carrying the substrate outward (operation S170).

S110: A pre-processed substrate S, e.g., a substrate S on which a predetermined layer is deposited on the top surface thereof is horizontally carried into the chamber 100 by an external robot arm (not shown). The substrate S carried into the chamber 100 is disposed spaced apart from the lift pin 310 disposed at the inner lower portion of the chamber 100, and the robot arm is moved downwardly to seat the substrate S on the top surface of the lift pin 350 as illustrated in FIG. 1. In this time, the substrate holder 320 is disposed at a wait position in which the top surface of the substrate holder 320 is lower than that of the lift pin 310.

S120: Next, the lower electrode 500 and the substrate holder 320 connected to the lower electrode 500 are lifted toward the upper electrode 200 by the elevating member 600 connected to the lower electrode 500. At this time, the substrate S seated on the top surface of the lift pin 310 is seated on the top surface of the substrate holder 320 while the lower electrode 500 and the substrate holder 400 are lifted.

S130: Next, the substrate holder 320 on which the edge portion of the substrate S is seated is further lifted together with the lower electrode 500, and as illustrated in FIG. 3, when the hard stopper 400 is coupled to the groove 322 formed in the top surface of the seat 321 of the substrate holder 320, the lifting of the lower electrode 500 and the substrate holder 320 are stopped. The top surface of the substrate S seated on the top surface of the substrate holder 320 is spaced apart from the bottom surface of the upper electrode 200 by approximately 0.5 mm or less. At this time, the bottom surface of the substrate S is spaced apart from the lower electrode 500 by a distance at which the plasma can be generated.

S140: Then, the non-reaction gas is injected through the non-reaction gas injection holes 230 formed in the bottom surface of the upper electrode 200, and the reaction gas is injected through the first reaction gas injection holes 530 formed in the top surface of the lower electrode 500. The high frequency power is applied to the lower electrode 500. At this time, when the reaction gas is injected onto the bottom surface of the substrate S, the exhaust holes 324 formed in the sidewall 323 of the substrate holder 320 uniformly exhaust the reaction gas injected from the first reaction gas injection holes 530 in almost all direction to uniformly distribute the reaction gas over the bottom surface of the substrate S. Thus, the plasma is generated between the upper electrode 200 and the lower electrode 500, and the thin films or particles formed on the bottom surface of the substrate S are removed using the plasmatized reaction gas.

S150: Next, as illustrated in FIG. 4, the movement member 700 is downwardly moved to downwardly push the substrate holder 320, and the lower electrode 500 is further lifted due to the lifting of the elevating member 600 to seat the bottom surface of the substrate S on the top surface of the lower electrode 500. That is, when the movement member 700 is downwardly moved to downwardly push the substrate holder 320, the holder support 333 of the buffer member 330 connected to the substrate holder 320 is moved downwardly due to the shrinking of the elastic member 332. Thus, the seat 321 of the substrate holder 320 is moved to a position lower than their initial position. At this time, the lower electrode 500 is further lifted to seat the bottom surface of the substrate S on the top surface of the lower electrode 500. Thus, a bevel region of the substrate S is exposed toward the outside of the lower electrode 500. Also, in this case, the distance between the lower electrode 500 and the substrate S is maintained at approximately 0.5 mm or less.

S160: Then, the non-reaction gas is injected through the non-reaction gas injection holes 230 formed in the upper electrode 200, and the reaction gas is injected through the second reaction gas injection holes 560 formed in the lateral surface of the lower electrode 500. The high frequency power is applied to the lower electrode 500. Thus, the plasma is generated in the bevel region except a central portion of the substrate S, i.e., a region in which the patterns are formed, and the thin films or particles formed in the bevel region are removed by the plasmatized reaction gas.

S170: Next, the lower electrode 500 and the substrate holder 320 are lowered by the elevating member 600 connected to the bottom surface of the lower electrode 500. Thus, the compressed elastic member 332 disposed inside the body 331 of the buffer member 330 returns to its original shape. At this time, the movement member 700 may be moved upwardly. Thereafter, the substrate S seated on the top surface of the substrate holder 320 is seated on the top surface of the lift pin 310 while the substrate holder 320 is moved downward. The lower electrode 500 and the substrate holder 320 are further lowered to their original position in which the top surface of the substrate holder 320 is lower than that of the lift pin 310 (See FIG. 1). Then, the substrate S seated on the top surface of the lift pin 310 is carried to the outside of the chamber 100 by the external robot arm.

Although the substrate backside etching process is performed, and then the substrate bevel etching process is performed in the plasma processing method in accordance with an exemplary embodiment, the present invention is not limited thereto. For example, the substrate bevel etching process may be performed first, and then, the substrate backside etching process may be performed. That is, the lower electrode 500 is moved upwardly to seat the substrate S on the top surface of the lower electrode 500, and simultaneously, the substrate holder 320 is moved downwardly using the movement member 700 to each the bevel region of the substrate S. Thereafter, the lower electrode 500 is moved downwardly, and simultaneously, the movement member 700 is moved upwardly to upwardly move the substrate holder 320. Thus, the edge portion of the bottom surface of the substrate S may be seated on the seat 321 of the substrate holder 320 to each the bottom surface of the substrate S.

Although the lifting of the substrate holder 320 is stopped by the hard stopper 400 and the substrate holder 320 is moved downwardly using the movement member 700 in the exemplary embodiment, the present invention is not limited thereto. For example, the movement member 700 can simultaneously perform the function of the hard stopper 400 without forming the hard stopper 400. That is, a portion of the movement member 700 protrudes downward in an initial state, and when the substrate holder 320 is lifted, the movement of the substrate holder 320 is stopped by the protruding portion of the movement member 700. Thereafter, the substrate backside etching process is performed. At this time, the movement member 700 protrudes up to a height by which the substrate S is spaced a predetermined distance from the upper electrode 200. Then, the movement member 700 is downwardly moved to downwardly move the substrate holder 329, and the lower electrode 500 supports the bottom surface of the substrate S to perform the substrate bevel etching process.

Figure 5:
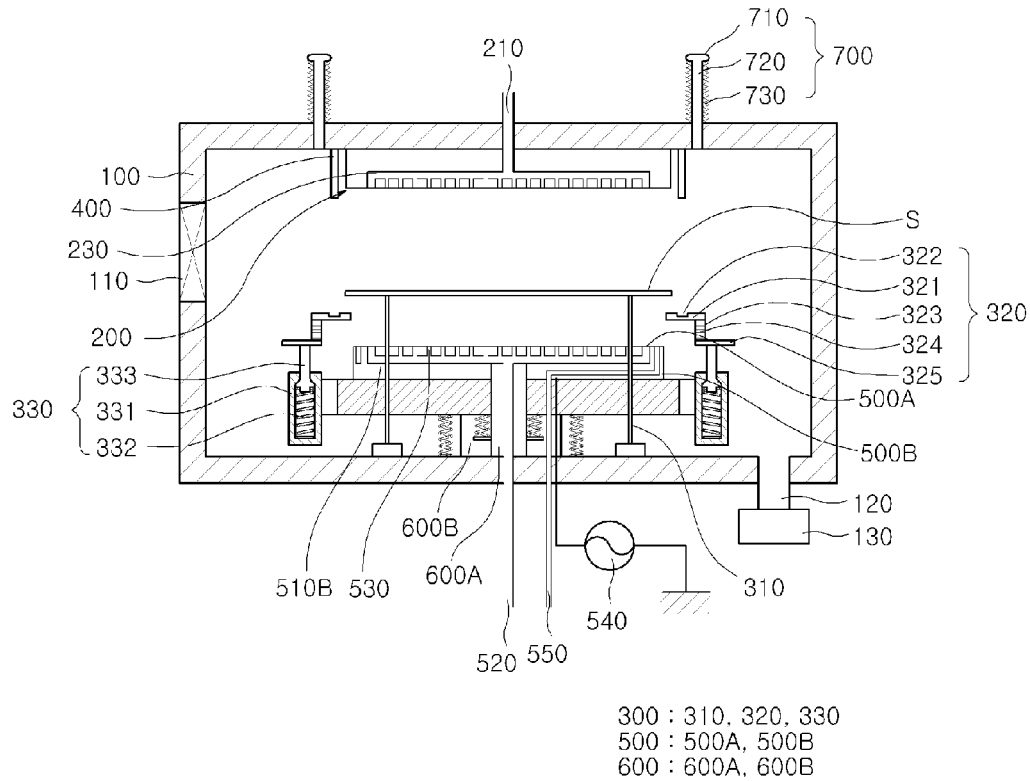
FIG. 5 is a cross-sectional view of a plasma processing apparatus in accordance with another exemplary embodiment
Figure 6:
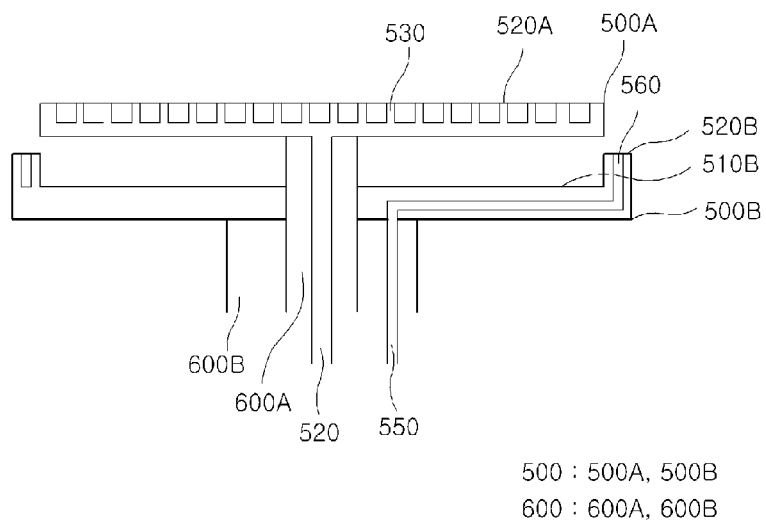
FIG. 6 is a cross-sectional view of a lower electrode used in a plasma processing apparatus in accordance with another exemplary embodiment

FIG. 5 is a cross-sectional view of a plasma processing apparatus in accordance with another exemplary embodiment, and FIG. 6 is a cross-sectional view of a lower electrode used in a plasma processing apparatus in accordance with another exemplary embodiment. When comparing a plasma processing apparatus in accordance with another exemplary embodiment with the plasma processing apparatus in accordance with an exemplary embodiment, configurations of the lower electrode 500 are different from each other. Thus, duplicated descriptions will be omitted, and the configuration of the lower electrode 500 will be mainly described.

Referring to FIGS. 5 and 6, a plasma processing apparatus in accordance with another exemplary embodiment includes a chamber 100, an upper electrode 200, a substrate support 300, a hard stopper 400, a lower electrode 500, and an elevating member 600. The upper electrode 200 is provided at an inner upper portion of the chamber 100 and connected to a ground terminal. The substrate support 300 is provided at an inner lower portion of the chamber 100 to support a substrate S. The hard stopper 400 is provided at the inner upper portion of the chamber 100 and in contact with the substrate support 300 to maintain a distance between the upper electrode 200 and the substrate S. A portion of the substrate support 300 is fixed to a side of the lower electrode 500, and a power is applied to the lower electrode 500. The elevating member 600 raises and lowers the substrate support 300 and the lower electrode 500. The plasma processing apparatus further includes a movement member 700 configured to move the substrate support 300. The lower electrode 500 includes a first lower electrode 500A and a second lower electrode 500B which can be separated from and coupled to each other. A first reaction gas injection hole 530 configured to supply a reaction gas for etching a bottom surface of the substrate S is formed in a top surface of the first lower electrode 500A. A second gas injection hole 560 configured to supply a reaction gas for etching a bevel of the substrate S may be formed in a lateral surface or a top surface of the second lower electrode 500B. The second reaction gas injection hole 560 may supply the reaction gas during to a substrate backside etching process.

The lower electrode 500 may have a circular plate shape, and also, the lower electrode 500 may have a shape corresponding to that of the substrate S. That is, the lower electrode 500 has a circular shape when the substrate S has a circular shape equal to that of the wafer, and the lower electrode 500 has a rectangular shape when the substrate S has a rectangular shape equal to that of the glass substrate. As illustrated in FIG. 2, the lower electrode 500 includes a first lower electrode 500A and a second lower electrode 500B which can be separated from and coupled to each other. The second lower electrode 500B includes a recess 510B formed in a central region and a top surface 520B disposed in an edge region except the recess 510B. The first lower electrode 500A has a shape and size corresponding to those of the recess 510B of the second lower electrode 500B. Thus, the first lower electrode 500A is seated on the recess 510B of the second lower electrode 500B to couple the first and second lower electrodes 500A and 500B to each other. The first lower electrode 500A has a thickness corresponding to a height ranging from the recess 510B up to the top surface 520B of the second lower electrode 500B. Thus, when the first and second lower electrodes 500A and 500B are coupled to each other, a height difference between a top surface 520A of the first lower electrode 500A and the top surface 520B of the second lower electrode 500B is not generated. Thus, the top surface 520A of the first lower electrode 500A is flush with the top surface 520B of the second lower electrode 500B. The first lower electrode 500A may have a size less than that of the substrate S. For example, the first lower electrode 500A may have a size equal to that of the substrate S except the bevel region. The second lower electrode 500B may have a size greater than that of the substrate S. A plurality of first reaction gas injection holes 530 configured to supply a reaction gas onto the bottom surface of the substrate S in order to each the bottom surface of the substrate S is formed in the top surface 520A of the first lower electrode 500A. A second gas injection hole 560 configured to supply the reaction gas into a bevel region of the substrate S in order to etch a bevel of the substrate S is formed in the top surface 520B of the second lower electrode 500B. The second reaction gas injection hole 560 can inject the reaction gas during the substrate backside etching process as well as the substrate bevel etching process. The first reaction gas injection holes 530 communicate with a first reaction gas injection supply part 520, and the second reaction gas injection hole 560 communicates with a second reaction gas supply part 550. The first reaction gas injection holes 530 and the second reaction gas injection hole 560 may have various shapes such as a circular shape and an oval shape, respectively. A high frequency power supply 540 for applying a high frequency signal to the second lower electrode 500B is disposed under the second lower electrode 500B. The high frequency signal applied from the high frequency power supply 540 activates the reaction gas injected through the first and second reaction gas injection holes 530 and 560 to generate the plasma in a space formed under the substrate S. In case where the first lower electrode 500A is coupled to the second lower electrode 500B, the first lower electrode 500A is electrically connected to the second lower electrode 500B. Thus, the high frequency power applied to the second lower electrode 500B is also applied to the first lower electrode 500A. However, in case where the first lower electrode 500A is separated from the second lower electrode 500B, the first lower electrode 500A is electrically insulated from the second lower electrode 500B. Thus, the high frequency power applied to the second lower electrode 500B is not applied to the first lower electrode 500A. The reaction gas supplied through the first and second reaction gas supply parts 520 and 550 may include at least one of fluorine-based gases such as $CF_4$, $CHF_4$, $SF_6$, $NF_3$, $C_2F_6$, $C_4F_8$, $F_2$, and $F_2N_2$ and chlorine-based gases such as $BCl_3$ and $Cl_2$. The insulating plate 510 may be disposed on a lower portion of the lower electrode 500. The insulating plate 510 supports the lower electrode 500.

Although the second reaction gas injection hole 560 configured to supply the reaction gas during the substrate bevel etching process is formed in the top surface 520B of the second lower electrode 500B in accordance with another exemplary embodiment, the present invention is not limited thereto. For example, the second reaction gas injection hole 560 may be formed in a lateral surface of the second lower electrode 500B. In addition, a third reaction gas injection hole may be also formed in the upper electrode 200. Also, the third reaction gas injection hole may be spaced from the upper electrode 200 and formed in an inner upper wall of the chamber 100. The third reaction gas injection hole injects the reaction gas during the substrate backside etching and substrate bevel etching processes.

In the plasma processing apparatus in accordance with an exemplary embodiment, the substrate holder 320 configured to support the substrate S is lifted and coupled to the hard stopper 400 to space the substrate S from the upper electrode 200 by a predetermined distance. And then, the substrate backside etching process is performed. The first lower electrode 500A is lifted to support the substrate S on the top surface of the first lower electrode 500A, and the substrate holder 320 is downwardly moved by the movement member 700 to perform the substrate bevel etching process. A plasma processing method in accordance with an exemplary embodiment will be described with reference to FIGS. 7 through 9.

Figure 7:
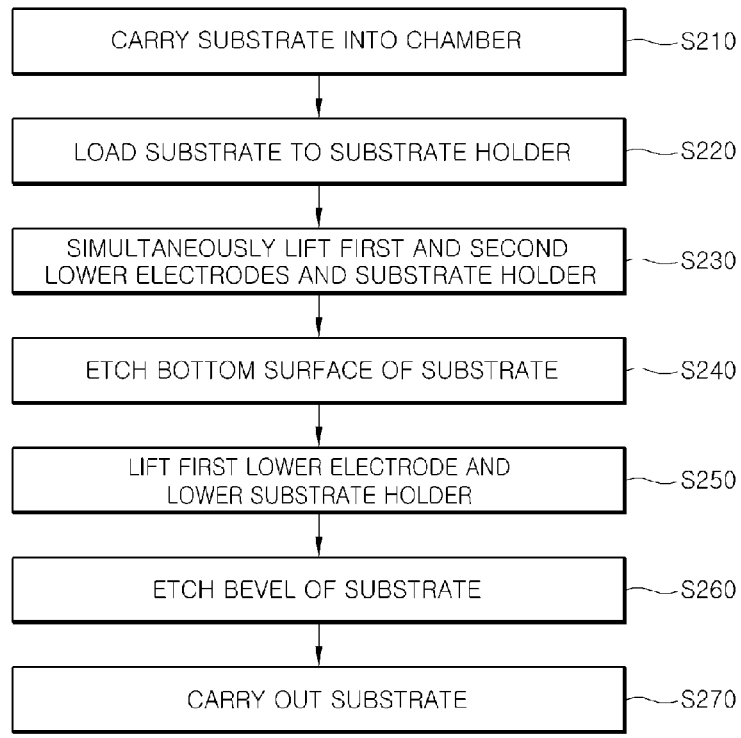
FIG. 7 is a flowchart of a plasma processing method in accordance with another exemplary embodiment
Figure 8:
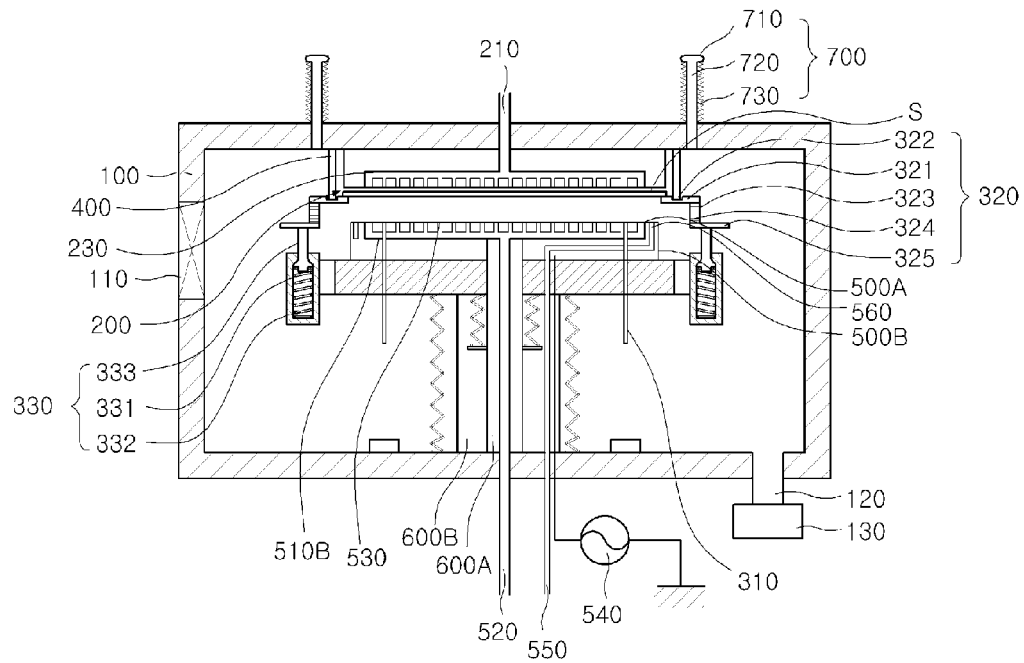
FIGS. 8 and 9 are cross-sectional views of a plasma processing apparatus in each of processes constituting a plasma processing method in accordance with another exemplary embodiment
Figure 9:
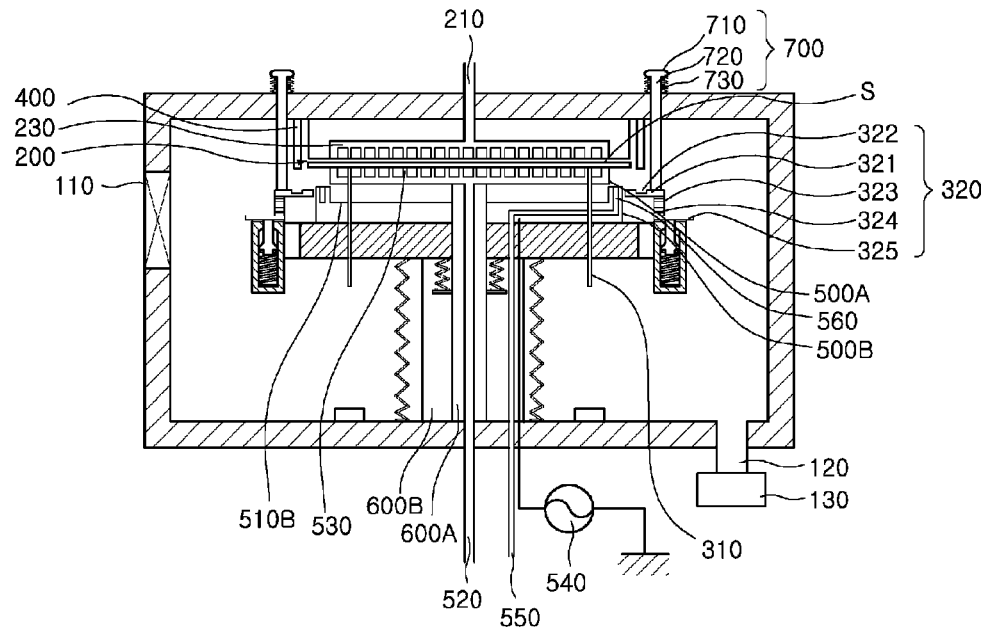

FIG. 7 is a flowchart of a plasma processing method in accordance with another exemplary embodiment, and FIGS. 8 and 9 are cross-sectional views of a plasma processing apparatus in each of processes constituting a plasma processing method in accordance with another exemplary embodiment.

Referring to FIG. 7, the plasma processing method in accordance with another exemplary embodiment includes carrying the substrate S into the chamber 100 (operation S210), loading the substrate S on the substrate holder 320 (operation S220), simultaneously lifting the substrate holder 320 and the lower electrode 500 (operation S230), etching the bottom surface of the substrate S (operation S240), downwardly moving the substrate holder 320 to support the substrate S on the top surface of the first lower electrode 500A (operation S250), etching the bevel of the substrate S (operation S260), and carrying the substrate outward (operation S270). Hereinafter, the essential feature that is different from an embodiment will be mainly described.

S210: A pre-processed substrate S is horizontally carried into the chamber 100 by an external robot arm (not shown). The substrate S carried into the chamber 100 is disposed spaced apart from the lift pin 310 disposed at the inner lower portion of the chamber 100, and the robot arm is moved downwardly to seat the substrate S on the top surface of the lift pin 350.

S220: Next, the lower electrode 500 and the substrate holder 320 connected to the lower electrode 500 are lifted toward the upper electrode 200 by a second elevating member 600B connected to the bottom surface of the second lower electrode 500B. At this time, the substrate S seated on the top surface of the lift pin 310 is seated on the top surface of the substrate holder 320 while the lower electrode 500 and the substrate holder 400 are lifted.

S230: Next, the substrate holder 320 on which the edge portion of the substrate S is seated is further lifted together with the lower electrode 500, and as illustrated in FIG. 8, when the hard stopper 400 is coupled to the groove 322 formed in the top surface of the seat 321 of the substrate holder 320, the lifting of the lower electrode 500 and the substrate holder 320 are stopped.

S240: Then, the non-reaction gas is injected through the non-reaction gas injection holes 230 formed in the bottom surface of the upper electrode 200, and the reaction gas is injected through the first reaction gas injection holes 530 formed in the top surface 520A of the first lower electrode 500A. The high frequency power is applied to the second lower electrode 500B. At this time, the reaction gas may be injected through the second reaction gas injection hole 560. When the reaction gas is injected onto the bottom surface of the substrate S, the exhaust holes 324 formed in the sidewall 323 of the substrate holder 320 uniformly exhaust the reaction gas injected from the first reaction gas injection holes 530 in almost all direction to uniformly distribute the reaction gas over the bottom surface of the substrate S. Thus, the plasma is generated between the upper electrode 200 and the lower electrode 500, and the thin films or particles formed on the bottom surface of the substrate S are removed using the plasmatized reaction gas.

S250: Next, as illustrated in FIG. 9, the movement member 700 is downwardly moved to downwardly push the substrate holder 320, and the first lower electrode 500A is further lifted due to the lifting of a first elevating member 600A to seat the bottom surface of the substrate S on the top surface 520A of the first lower electrode 500A. That is, when the movement member 700 is downwardly moved to downwardly push the substrate holder 320, the holder support 333 of the buffer member 330 connected to the substrate holder 320 is moved downwardly due to the shrinking of the elastic member 332. Thus, the seat 321 of the substrate holder 320 is moved to a position lower than their initial position. At this time, the first lower electrode 500A is separated from the second lower electrode 500B, and thus, the first lower electrode 500A is further lifted to seat the bottom surface of the substrate S on the top surface 520A of the first lower electrode 500A. Thus, a bevel region of the substrate S is exposed toward the outside of the first lower electrode 500A. Also, in this case, the distance between the first lower electrode 500A and the substrate S is maintained at approximately 0.5 mm or less.

S260: Then, the non-reaction gas is injected through the non-reaction gas injection holes 230 formed in the upper electrode 200, and the reaction gas is injected through the second reaction gas injection holes 560 formed in the top surface 520B of the second lower electrode 500B. The high frequency power is applied to the second lower electrode 500B. Thus, the plasma is generated in the bevel region except a central portion of the substrate S, i.e., a region in which the patterns are formed, and the thin films or particles formed in the bevel region are removed by the plasmatized reaction gas.

S270: Next, the first lower electrode 500A is lowered by the first elevating member 600A to couple the first lower electrode 500A to the second lower electrode 500B. Thereafter, the lower electrode 500 and the substrate holder 320 are lowered by the second elevating member 600B. Thus, the compressed elastic member 332 disposed inside the body 331 of the buffer member 330 returns to its original shape. At this time, the movement member 700 may be moved upwardly. Thereafter, the substrate S seated on the top surface of the substrate holder 320 is seated on the top surface of the lift pin 310 while the substrate holder 320 is moved downward. The lower electrode 500 and the substrate holder 320 are further lowered to their original position in which the top surface of the substrate holder 320 is lower than that of the lift pin 310 (See FIG. 1). Then, the substrate S seated on the top surface of the lift pin 310 is carried to the outside of the chamber 100 by the external robot arm.

Although the substrate backside etching process is performed, and then the substrate bevel etching process is performed in the plasma processing method in accordance with another exemplary embodiment, the present invention is not limited thereto. For example, the substrate bevel etching process may be performed first, and then, the substrate backside etching process may be performed. That is, the first lower electrode 500A is moved upwardly to seat the substrate S on the top surface of the first lower electrode 500A, and simultaneously, the substrate holder 320 is moved downwardly using the movement member 700 to each the bevel region of the substrate S. Thereafter, the first lower electrode 500A is moved downwardly, and simultaneously, the movement member 700 is moved upwardly to upwardly move the substrate holder 320. Thus, the edge portion of the bottom surface of the substrate S may be seated on the seat 321 of the substrate holder 320 to each the bottom surface of the substrate S.

Figure 10:
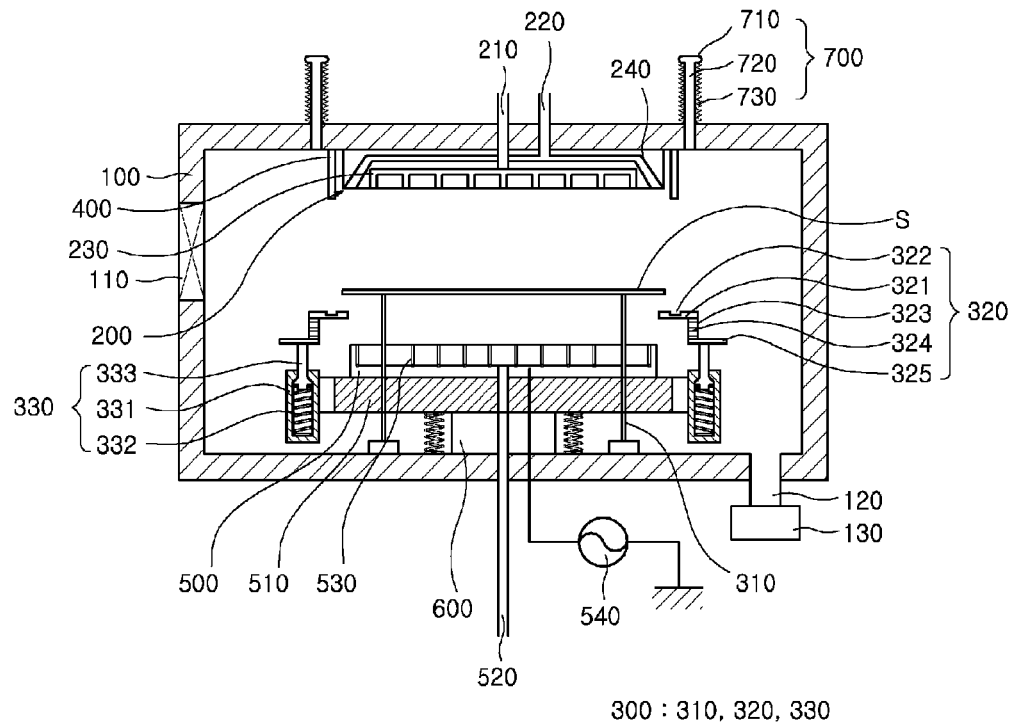
FIG. 10 is a cross-sectional view of a plasma processing apparatus in accordance with still another exemplary embodiment

FIG. 10 is a cross-sectional view of a plasma processing apparatus in accordance with still another exemplary embodiment.

When comparing a plasma processing apparatus in accordance with still another exemplary embodiment with the plasma processing apparatuses in accordance with an exemplary embodiment and another exemplary embodiment, configurations of an upper electrode and a lower electrode are different from each other. Hereinafter, a plasma processing apparatus in accordance with still another exemplary embodiment will be described with an emphasis on the configurations of the upper electrode and the lower electrode.

Referring to FIG. 10, a plasma processing apparatus in accordance with still another exemplary embodiment includes a chamber 100, an upper electrode 200, a substrate support 300, a hard stopper 400, a lower electrode 500, and an elevating member 600. The upper electrode 200 is provided at an inner upper portion of the chamber 100 and connected to a ground terminal. The substrate support 300 is provided at an inner lower portion of the chamber 100 to support a substrate S. The hard stopper 400 is provided at the inner upper portion of the chamber 100 and in contact with the substrate support 300 to maintain a distance between the upper electrode 200 and the substrate S. A portion of the substrate support 300 is fixed to a side of the lower electrode 500, and a power is applied to the lower electrode 500. The elevating member 600 raises and lowers the substrate support 300 and the lower electrode 500. The plasma processing apparatus further includes a movement member 700 configured to move the substrate support 300.

The upper electrode 200 protrudes from an inner surface of an upper portion of the chamber 200 and may have a circular plate shape. The upper electrode 200 is connected to the ground terminal to generate plasma using an electric potential difference between the upper electrode 200 and the lower electrode 500 in which a high frequency power is applied. The upper electrode 200 may have a diameter greater than that of the substrate S. Also, the upper electrode 200 may have the same diameter as that of a region except a bevel region, i.e., a central region of the substrate S. A plurality of non-reaction gas injection holes 230 and a first reaction gas injection hole 240 may be formed in the upper electrode 200, respectively. The non-reaction gas injection holes 230 inject a non-reaction gas into the substrate S such that a top surface of the substrate S is not damaged by the plasma during substrate backside etching and substrate bevel etching processes. For this, the non-reaction gas injection holes 230 may be formed in an entire surface of a bottom surface of the upper electrode 200. The non-reaction gas injection holes 230 may be formed in the bottom surface of the upper electrode 200 in a region corresponding to the top surface of the substrate S. Also, the first reaction gas injection hole 240 supplies the reaction gas during a substrate on a lower side of etching process. For this, the first reaction gas injection hole 240 may be formed in an edge region of a bottom surface except a region corresponding to the substrate S, or formed in a lateral surface of the upper electrode 200. The non-reaction gas injection holes 230 and the first reaction gas injection hole 240 may have various shapes such as a circular shape and an oval shape, respectively. The non-reaction gas injection holes 230 communicate with a non-reaction gas supply part 210, and the first reaction gas injection hole 240 communicates with a first reaction gas supply part 220. That is, the upper electrode 220 receives the non-reaction gas through the non-reaction gas supply part 210 and receives the reaction gas through the first reaction gas supply part 220. The non-reaction gas supply part 210 is separated from the first reaction gas supply part 220. The non-reaction gas supplied through the non-reaction gas supply part 210 may include a hydrogen gas, a nitrogen gas, or an inert gas. In addition, the non-reaction gas may include a non-reactive gas, i.e., a gas that does not react with the top surface of the substrate S. The reaction gas supplied through the first reaction gas supply part 210 may include at least one of fluorine-based gases such as $CF_4$, $CHF_4$, $SF_6$, $NF_3$, $C_2F_6$, $C_4F_8$, $F_2$, and $F_2N_2$ and chlorine-based gases such as $BCl_3$ and $Cl_2$. The substrate S may include a wafer for manufacturing a semiconductor device or a glass substrate for manufacturing a display device. The top surface of the substrate S may be a surface on which a device having predetermined thin film patterns is formed or a surface on which an etching of the substrate S is not required. A cooling passage (not shown) connected to a cooling water circulation unit (not shown) disposed outside the chamber 100 may be provided inside the upper electrode 200.

The lower electrode 500 may have a circular plate shape, and also, the lower electrode 500 may have a shape corresponding to that of the substrate S. A second reaction gas injection hole 530 configured to supply the reaction gas onto the bottom surface of the substrate S in order to etch a bottom surface of the substrate S is formed in a top surface of the lower electrode 500. A second reaction gas supply part 520 configured to supply the reaction gas into the second reaction gas injection hole 530 is formed in a bottom surface of the lower electrode 500, and the second reaction gas supply part 520 communicates with the second reaction gas injection hole 530. The second reaction gas injection hole formed in the top surface of the lower electrode 500 may have various shapes such as a circular shape and a polygonal shape. A high frequency power supply 540 for applying a high frequency signal to the lower electrode 500 is disposed under the lower electrode 500. The high frequency signal applied from the high frequency power supply 540 activates the reaction gas injected through the second reaction gas injection hole 530 to generate the plasma in a space formed under the substrate S. An insulating plate 510 may be provided on a lower portion of the lower electrode 500, and the insulating plate 510 supports the lower electrode 500.

Although the reaction gas for etching a bevel of the substrate S is injected through the first reaction gas injection hole 240 formed in the upper substrate 200 in accordance with still another exemplary embodiment, the present invention is not limited thereto. For example, the first reaction gas injection hole 240 may be spaced from the upper electrode 200 and disposed in an upper portion of the chamber 100. In this case, the first reaction gas injection hole 240 may pass through an upper wall of the chamber 100 between the upper electrode 200 and the hard stopper 400.

A plasma processing method in accordance with still another exemplary embodiment will now be described with reference to FIGS. 11 through 14.

Figure 11:
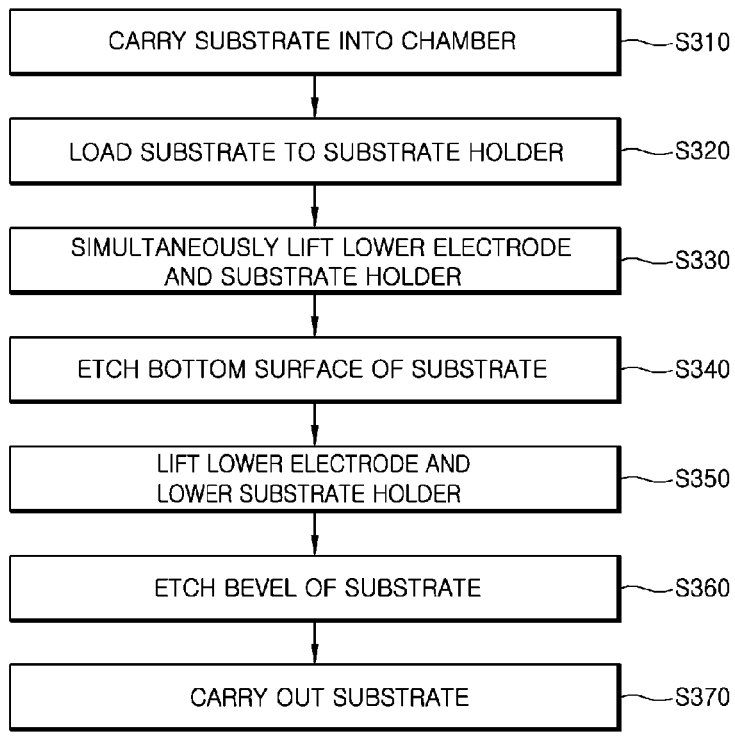
FIG. 11 is a flowchart of a plasma processing method in accordance with still another exemplary embodiment and FIGS. 12 through 14 are cross-sectional views of a plasma processing apparatus in each of processes constituting a plasma processing method in accordance with still another exemplary embodiment.
Figure 12:
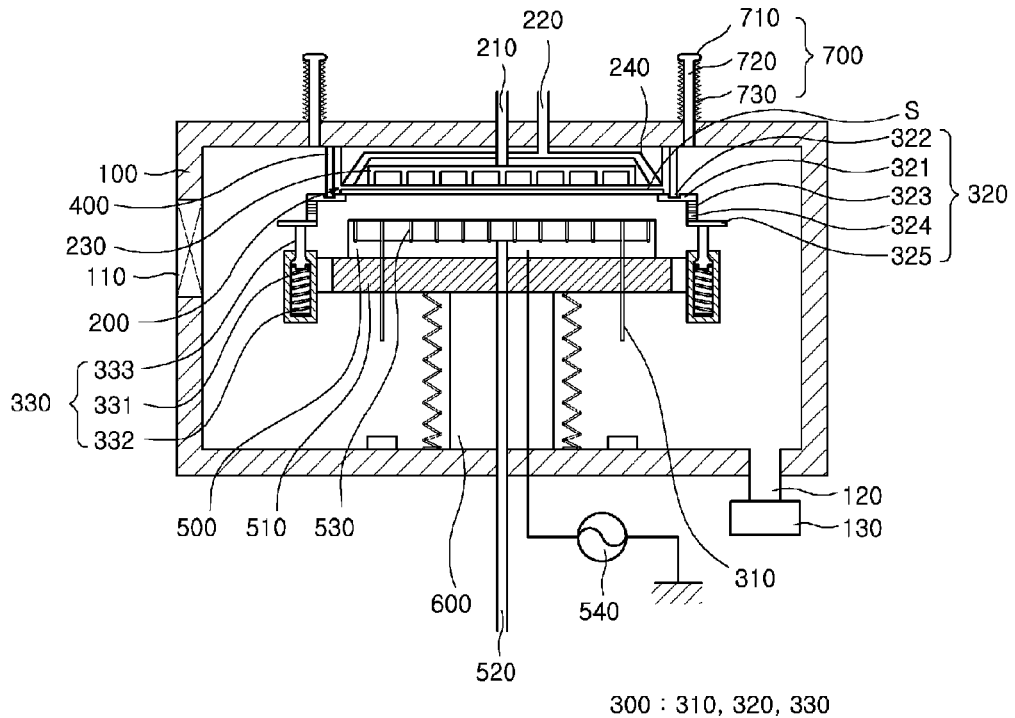
Figure 13:
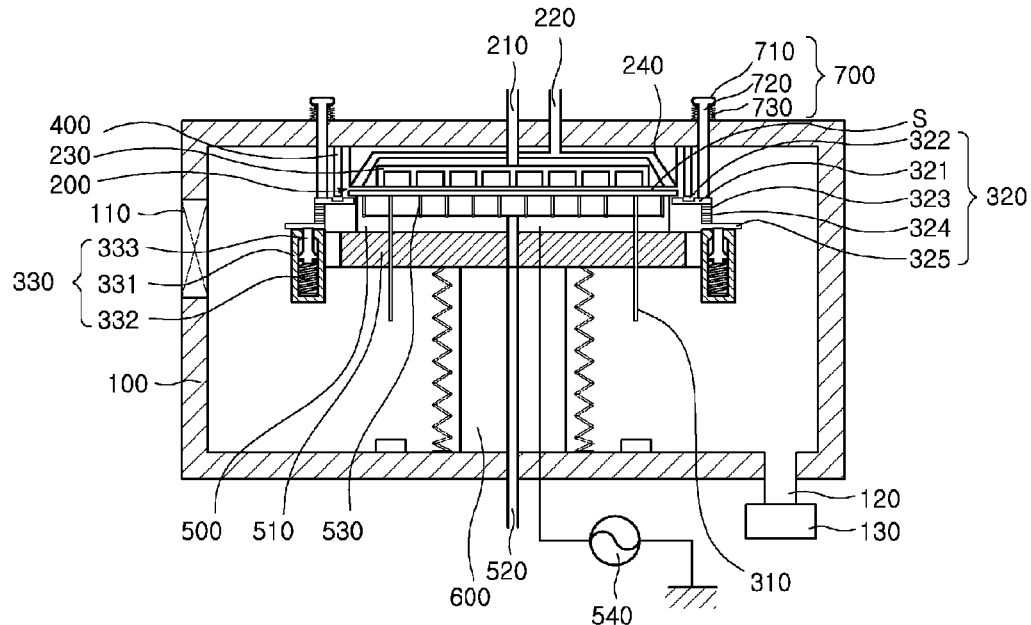
Figure 14:
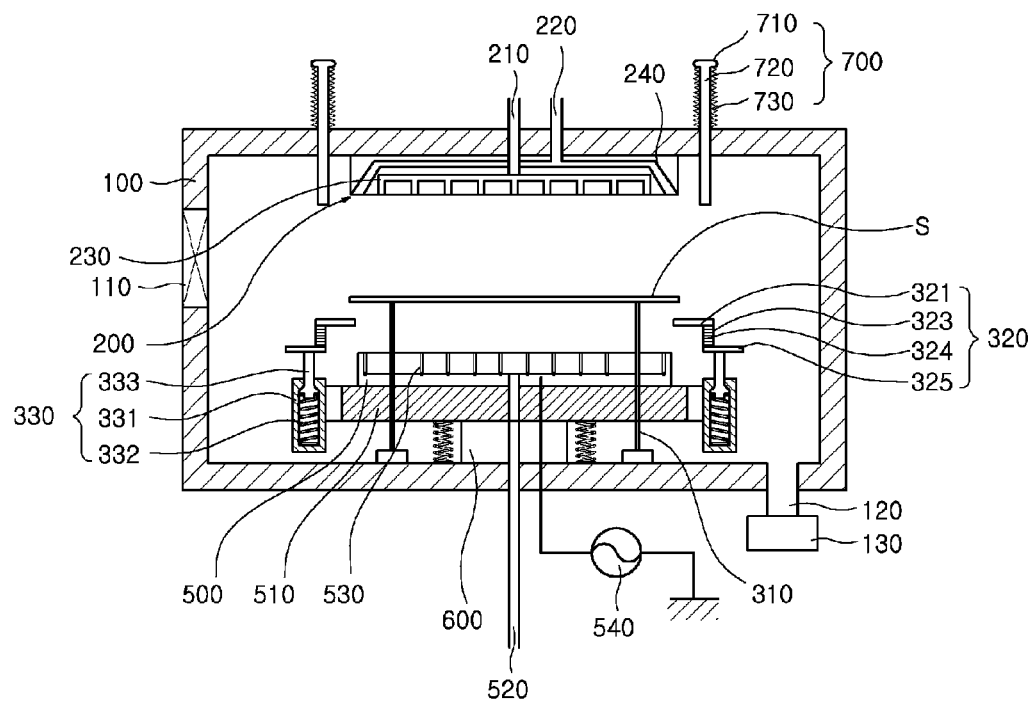

FIG. 11 is a flowchart of a plasma processing method in accordance with still another exemplary embodiment, and FIGS. 12 through 14 are cross-sectional views of a plasma processing apparatus in each of processes constituting a plasma processing method in accordance with still another exemplary embodiment.

Referring to FIG. 11, the plasma processing method in accordance with another exemplary embodiment includes carrying the substrate S into the chamber 100 (operation S310), loading the substrate S on the substrate holder 320 (operation S320), simultaneously lifting the substrate holder 320 and the lower electrode 500 (operation S330), etching the bottom surface of the substrate S (operation S340), downwardly moving the substrate holder 320 to support the substrate S on the top surface of the lower electrode 500 (operation S350), etching the bevel of the substrate S (operation S360), and carrying the substrate outward (operation S370). Hereinafter, the essential feature that is different from an embodiment and another embodiment will be mainly described.

S310: A pre-processed substrate S is horizontally carried into the chamber 100 by an external robot arm (not shown). The substrate S carried into the chamber 100 is disposed spaced apart from the lift pin 310 disposed at the inner lower portion of the chamber 100, and the robot arm is moved downwardly to seat the substrate S on the top surface of the lift pin 350.

S320: Next, the lower electrode 500 and the substrate holder 320 connected to the lower electrode 500 are lifted toward the upper electrode 200 by the elevating member 600 connected to the bottom surface of the lower electrode 500. At this time, the substrate S seated on the top surface of the lift pin 310 is seated on the top surface of the substrate holder 320 while the lower electrode 500 and the substrate holder 400 are lifted.

S330: Next, the substrate holder 320 on which the edge portion of the substrate S is seated is further lifted together with the lower electrode 500, and as illustrated in FIG. 12, when the hard stopper 400 is coupled to the groove 322 formed in the top surface of the seat 321 of the substrate holder 320, the lifting of the lower electrode 500 and the substrate holder 320 are stopped.

S340: Then, the non-reaction gas and the reaction gas are injected through the non-reaction gas injection holes 230 formed in the bottom surface of the upper electrode 200 and the second reaction gas injection hole 530 formed in the top surface of the lower electrode 500, respectively. The high frequency power is applied to the lower electrode 500. Thus, the plasma is generated between the upper electrode 200 and the lower electrode 500, and the thin films or particles formed on the bottom surface of the substrate S are removed using the plasmatized reaction gas. When the reaction gas is injected onto the bottom surface of the substrate S, the exhaust holes 324 formed in the sidewall 323 of the substrate holder 320 uniformly exhaust the reaction gas injected from the second reaction gas injection holes 530 in almost all direction to uniformly distribute the reaction gas over the bottom surface of the substrate S.

S350: Next, as illustrated in FIG. 13, the movement member 700 is downwardly moved to downwardly push the substrate holder 320, and the lower electrode 500 is further lifted due to the lifting of the elevating member 600 to seat the bottom surface of the substrate S on the top surface of the lower electrode 500. That is, when the movement member 700 is downwardly moved to downwardly push the substrate holder 320, the holder support 333 of the buffer member 330 connected to the substrate holder 320 is moved downwardly due to the shrinking of the elastic member 332. Thus, the seat 321 of the substrate holder 320 is moved to a position lower than their initial position. At this time, the lower electrode 500 is further lifted to seat the bottom surface of the substrate S on the top surface of the lower electrode 500. Thus, a bevel region of the substrate S is exposed toward the outside of the lower electrode 500. Also, in this case, the distance between the lower electrode 500 and the substrate S is maintained at approximately 0.5 mm or less.

S360: Then, the non-reaction gas and the reaction gas are injected through the non-reaction gas injection holes 230 and the first reaction gas injection hole 240 formed in the upper electrode 200, respectively. The high frequency power is applied to the lower electrode 500. Thus, the plasma is generated in the bevel region except a central portion of the substrate S, i.e., a region in which the patterns are formed, and the thin films or particles formed in the bevel region are removed by the plasmatized reaction gas.

S370: Next, the lower electrode 500 and the substrate holder 320 are lowered by the elevating member 600 connected to the bottom surface of the lower electrode 500. Thus, the compressed elastic member 332 disposed inside the body 331 of the buffer member 330 returns to its original shape. At this time, the movement member 700 may be moved upwardly. Thereafter, the substrate S seated on the top surface of the substrate holder 320 is seated on the top surface of the lift pin 310 while the substrate holder 320 is moved downward. The lower electrode 500 and the substrate holder 320 are further lowered to their original position in which the top surface of the substrate holder 320 is lower than that of the lift pin 310. Then, the substrate S seated on the top surface of the lift pin 310 is carried to the outside of the chamber 100 by the external robot arm.

Although the substrate backside etching process is performed, and then the substrate bevel etching process is performed in the plasma processing method in accordance with still another exemplary embodiment, the present invention is not limited thereto. For example, the substrate bevel etching process may be performed first, and then, the substrate backside etching process may be performed. That is, the lower electrode 500 is moved upwardly to seat the substrate S on the top surface of the lower electrode 500, and simultaneously, the substrate holder 320 is moved downwardly using the movement member 700 to each the bevel region of the substrate S. Thereafter, the lower electrode 500 is moved downwardly, and simultaneously, the movement member 700 is moved upwardly to upwardly move the substrate holder 320. Thus, the edge portion of the bottom surface of the substrate S may be seated on the seat 321 of the substrate holder 320 to each the bottom surface of the substrate S.

Although the organic light emitting device has been described with reference to the specific embodiments, it is not limited thereto. Therefore, it will be readily understood by those skilled in the art that various modifications and changes can be made thereto without departing from the spirit and scope of the present invention formed by the appended claims.

INDUSTRIAL APPLICABILITY

The present invention can be used for completely removing films and particles accumulated on the bottom surface and in the bevel region of the water in a wafer etching process of a semiconductor manufacturing process, i.e., the wafer backside etching and wafer bevel etching processes.

The present invention is not limited to the previously described embodiments and can be applied to all plasma etching devices in which the wafer bevel region is etched using the plasma.

The invention claimed is:

1. A plasma processing apparatus comprising:
a chamber;
an upper electrode disposed at an inner upper portion of the chamber;
a lower electrode facing the upper electrode at an inner lower portion of the chamber to support a central region of a bottom surface of a substrate such that a bevel of the substrate is exposed in a substrate bevel etching process;
a substrate support disposed between the upper electrode and the lower electrode to support an edge portion of the substrate such that the central region of the bottom surface of the substrate is exposed in a substrate backside etching process; and
a movement member having a portion of the movement member extending through an upper side of the chamber into an inside thereof, the movement member configured to move the substrate support to separate the substrate from the substrate support in the substrate bevel etching process.

2. The plasma processing apparatus of claim 1, further comprising:
a non-reaction gas injection hole formed in a bottom surface of the upper electrode to inject a non-reaction gas;
a first reaction gas injection hole separated from the non-reaction gas injection hole to inject a reaction gas; and
a second reaction gas injection hole formed in a top surface of the lower electrode to inject the reaction gas.

3. The plasma processing apparatus of claim 2, wherein the first reaction gas injection hole is separated from the non-reaction gas injection hole and formed in an edge portion of the bottom surface of the upper electrode or a lateral surface of the upper electrode.

4. The plasma processing apparatus of claim 2, wherein the first reaction gas injection hole is spaced from the upper electrode and formed in an upper portion of the chamber.

5. The plasma processing apparatus of claim 1, further comprising first and second reaction gas injection holes formed in a top surface and a lateral surface of the lower electrode, respectively.

6. The plasma processing apparatus of claim 1, wherein the lower electrode comprises two sub-electrodes that are coupled to and separated from each other.

7. The plasma processing apparatus of claim 6, wherein the lower electrode comprises:
a first lower electrode disposed at a central portion in a plate shape; and
a second lower electrode separated from the first lower electrode, the second lower electrode being disposed outside the first lower electrode.

8. The plasma processing apparatus of claim 7, further comprising:
a first elevating member connected to a lower portion of the first lower electrode to move the first lower electrode upward and downward and
a second elevating member connected to a lower portion of the second lower electrode to move the second lower electrode upward and downward.

9. The plasma processing apparatus of claim 8, wherein the first elevating member is inserted into the second elevating member.

10. The plasma processing apparatus of claim 7, further comprising:
a non-reaction gas injection hole formed in a bottom surface of the upper electrode;
a first reaction gas injection hole formed in a top surface of the first lower electrode; and
a second reaction gas injection hole formed in a top surface or a lateral surface of the second lower electrode other than a recess of the second lower electrode.

11. The plasma processing apparatus of claim 10, further comprising a third reaction gas injection hole formed in the bottom surface of the upper electrode, the third reaction gas injection hole being separated from the non-reaction gas injection hole.

12. The plasma processing apparatus of claim 10, further comprising a third reaction gas injection hole formed in the upper portion of the chamber, the third reaction gas injection hole being spaced from the upper electrode.

13. The plasma processing apparatus of claim 1, wherein the substrate support comprises:
a substrate holder configured to support the substrate; and
a buffer member connecting the substrate holder to a lower lateral surface of the lower electrode.

14. The plasma processing apparatus of claim 13, wherein the substrate holder is disposed at a position higher than that of a top surface of the lower electrode.

15. The plasma processing apparatus of claim 13, wherein the buffer member comprises:
a body in which an inner space comprising an opened upper side is provided;
an elastic member disposed in the inner space of the body; and
a holder support disposed on an upper portion of the elastic member and extended to protrude toward an upper portion of the body.

16. The plasma processing apparatus of claim 1, further comprising a hard stopper disposed in an upper portion of the chamber, the hard stopper being spaced from the upper electrode.

17. The plasma processing apparatus of claim 1, wherein the movement member is movable vertically and moved downwardly to push and move the substrate holder downward.

18. A plasma processing method comprising:
using a plasma processing apparatus comprising: a chamber; an upper electrode disposed at an inner upper portion of the chamber; a lower electrode facing the upper electrode at an inner lower portion of the chamber to support a central region of a bottom surface of a substrate such that a bevel of the substrate is exposed in a substrate bevel etching process; a substrate support disposed between the upper electrode and the lower electrode to support an edge portion of the substrate such that the central region of the bottom surface of the substrate is exposed in a substrate backside etching process; and a movement member having a portion of the movement member extending through an upper side of the chamber into an inside thereof, the movement member, the movement member configured to move the substrate support to separate the substrate from the substrate support in the substrate bevel etching process;
carrying a substrate into the chamber;

etching the bottom surface of the substrate after supporting the edge portion of the substrate such that the central region of the substrate is exposed using the substrate support;

after etching the bottom surface of the substrate, etching the bevel of the substrate after supporting the central region of the substrate such that the bevel of the substrate is exposed using the lower electrode; and separating the substrate support from the substrate using the movement member.

19. The plasma processing method of claim 18, wherein after loading the substrate into the chamber, the plasma processing method further comprises:

injecting a non-reaction gas through a bottom surface of an upper electrode disposed at an upper portion of the chamber; and injecting a reaction gas through a top surface and a lateral surface of a lower electrode disposed at a lower portion of the chamber to etch the bottom surface and the bevel of the substrate within the chamber.

20. The plasma processing method of claim 18, wherein after loading the substrate into the chamber, the plasma processing method further comprises:

injecting a non-reaction gas through a bottom surface of an upper electrode disposed at an upper portion of the chamber; and injecting a reaction gas through top surfaces of first and second lower electrodes disposed at a lower portion of the chamber to etch the bottom surface and the bevel of the substrate within the chamber.

* * * * *